(12) United States Patent
Liang et al.

(10) Patent No.: US 11,574,766 B2
(45) Date of Patent: Feb. 7, 2023

(54) TECHNIQUES FOR A COUPLED INDUCTOR CIRCUIT

(71) Applicant: Analog Devices International Unlimited Company, Limerick (IE)

(72) Inventors: Xinyu Liang, San Jose, CA (US); Jonathan Paolucci, Santa Clara, CA (US); Leonard Shtargot, Campbell, CA (US)

(73) Assignee: Analog Devices International Unlimited Company, Limerick (IE)

( * ) Notice: Subject to any disclaimer, the term of this patent is extended or adjusted under 35 U.S.C. 154(b) by 434 days.

(21) Appl. No.: 16/851,880

(22) Filed: Apr. 17, 2020

(65) Prior Publication Data
US 2021/0327634 A1 Oct. 21, 2021

(51) Int. Cl.
*H05K 1/16* (2006.01)
*H01F 27/28* (2006.01)
(Continued)

(52) U.S. Cl.
CPC ......... *H01F 27/2804* (2013.01); *H01F 27/24* (2013.01); *H01F 29/025* (2013.01);
(Continued)

(58) Field of Classification Search
CPC .... H01F 27/2804; H01F 27/24; H01F 29/025; H01F 2027/2819; H05K 1/165; H05K 2201/086
See application file for complete search history.

(56) References Cited

U.S. PATENT DOCUMENTS

| 4,058,758 A | 11/1977 | Peterson |
| 6,043,993 A * | 3/2000 | Kobori ............... H02M 3/3376 363/25 |

(Continued)

FOREIGN PATENT DOCUMENTS

| CN | 103141021 | 9/2015 |
| CN | 105720824 | 6/2016 |

(Continued)

OTHER PUBLICATIONS

"U.S. Appl. No. 16/169,338, Non Final Office Action dated Sep. 30, 2019", 21 pgs.

(Continued)

*Primary Examiner* — Hoa C Nguyen
(74) *Attorney, Agent, or Firm* — Schwegman Lundberg & Woessner, P.A.

(57) ABSTRACT

A space efficient planar transformer can include a coupled inductor circuit that can include a metallic core, a first planar winding comprising a conductive coil having an electrical path encircling a first post of the metallic core, and a second planar winding configured to magnetically couple with the first winding via the metallic core. The second planar winding can have multiple portions. A portion of the second winding can include a first sub-portion comprising a single U-shaped planar conductive trace wrapped about the first post and a second sub-portion comprising a single U-shaped planar conductive trace wrapped about the first post. A layout of the first sub-portion can be oriented opposite a layout of the second sub-portion.

16 Claims, 13 Drawing Sheets

(51) Int. Cl.
  *H01F 27/24* (2006.01)
  *H01F 29/02* (2006.01)
(52) U.S. Cl.
  CPC ..... *H05K 1/165* (2013.01); *H01F 2027/2819* (2013.01); *H05K 2201/086* (2013.01)

(56) References Cited

U.S. PATENT DOCUMENTS

| | | | | |
|---|---|---|---|---|
| 6,181,116 | B1 * | 1/2001 | Jansen | H02M 7/066 |
| | | | | 363/16 |
| 6,396,715 | B1 * | 5/2002 | Zhang | H02M 1/10 |
| | | | | 363/17 |
| 6,577,512 | B2 * | 6/2003 | Tripathi | H05B 45/10 |
| | | | | 363/21.17 |
| 7,129,784 | B2 | 10/2006 | Bhatti et al. | |
| 7,136,294 | B2 * | 11/2006 | Phadke | H02M 3/3376 |
| | | | | 363/17 |
| 7,283,379 | B2 * | 10/2007 | Baker | H02M 7/5387 |
| | | | | 363/17 |
| 7,298,238 | B1 | 11/2007 | Eaton et al. | |
| 7,332,993 | B1 | 2/2008 | Nussbaum | |
| 7,576,607 | B2 | 8/2009 | Lee et al. | |
| 7,915,989 | B2 | 3/2011 | Li et al. | |
| 7,915,991 | B2 | 3/2011 | Waffenschmidt et al. | |
| 7,940,152 | B1 | 5/2011 | Kim et al. | |
| 7,944,296 | B1 | 5/2011 | Lee et al. | |
| 8,044,732 | B2 | 10/2011 | Kossel et al. | |
| 8,068,355 | B1 | 11/2011 | Ikriannikov et al. | |
| 8,725,085 | B2 | 5/2014 | Darabi et al. | |
| 8,842,410 | B2 | 9/2014 | Chan | |
| 9,379,629 | B2 | 6/2016 | Chandrasekaran | |
| 9,966,837 | B1 * | 5/2018 | Seaton | H02M 1/32 |
| 2003/0218892 | A1 * | 11/2003 | Nakagawa | H02M 3/33576 |
| | | | | 363/56.12 |
| 2004/0017276 | A1 | 1/2004 | Chen et al. | |
| 2006/0066431 | A1 | 3/2006 | Anand et al. | |
| 2006/0120116 | A1 | 6/2006 | Lipcsei et al. | |
| 2006/0197510 | A1 | 9/2006 | Chandrasekaran | |
| 2007/0103941 | A1 | 5/2007 | Liu et al. | |
| 2007/0152795 | A1 | 7/2007 | Zeng et al. | |
| 2008/0101099 | A1 * | 5/2008 | Jacobs | H02M 1/14 |
| | | | | 363/47 |
| 2009/0109710 | A1 | 4/2009 | Nakahori | |
| 2011/0215865 | A1 | 9/2011 | Nam et al. | |
| 2014/0153294 | A1 | 6/2014 | Deboy et al. | |
| 2016/0020016 | A1 | 1/2016 | Ouyang et al. | |
| 2016/0164505 | A1 | 6/2016 | Naaman et al. | |
| 2017/0085183 | A1 | 3/2017 | Notsch | |
| 2017/0271073 | A1 | 9/2017 | Zeng et al. | |
| 2017/0310228 | A1 | 10/2017 | Nakajima et al. | |
| 2018/0069485 | A1 | 3/2018 | Hsiao et al. | |
| 2021/0327633 | A1 | 10/2021 | Paolucci | |

FOREIGN PATENT DOCUMENTS

| | | |
|---|---|---|
| CN | 113541498 | 10/2021 |
| EP | 0050432 | 4/1982 |
| EP | 0302162 | 2/1989 |
| GB | 2445677 | 7/2008 |
| JP | 4149915 | 7/2008 |
| JP | 2010045127 | 2/2010 |
| TW | I220994 | 9/2004 |
| TW | 201421886 | 6/2014 |
| WO | 2013107782 | 7/2013 |

OTHER PUBLICATIONS

"U.S. Appl. No. 16/169,338, Response filed Dec. 30, 2019 to Non Final Office Action dated Sep. 30, 2019", 11 pgs.

"European Application Serial No. 19202178.0, Extended European Search Report dated Apr. 6, 2020", 11 pgs.

"U.S. Appl. No. 16/169,338, Final Office Action dated Apr. 13, 2020", 20 pgs.

"U.S. Appl. No. 16/851,815, Non Final Office Action dated Jan. 6, 2022", 16 pgs.

"Taiwanese U.S. Appl. No. 16/851,815, Office Action dated Feb. 17, 2022", w/ English Translation, 18 pgs.

"U.S. Appl. No. 16/851,815, Response filed May 4, 2022 to Non Final Office Action dated Jan. 6, 2022", 12 pgs.

U.S. Appl. No. 16/851,815, filed Apr. 17, 2020, Segmented Winding Center-Tap Techniques for a Coupled Inductor Circuit.

"International Application Serial No. PCT/EP2021/059499, International Search Report dated Jul. 30, 2021", 5 pgs.

"International Application Serial No. PCT/EP2021/059499, Written Opinion dated Jul. 30, 2021", 10 pgs.

"Taiwanese Application Serial No. 110113212, Voluntary Amendment filed Jul. 5, 2021", w/English Claims, 55 pgs.

"European Application Serial No. 21164527.0, Extended European Search Report dated Sep. 9, 2021", 14 pgs.

"International Application Serial No. PCT/EP2021/059499, International Preliminary Report on Patentability dated Oct. 27, 2022", 12 pgs.

* cited by examiner

400

| |
|---|
| SECOND WINDING A |
| FIRST WINDING |
| SECOND WINDING B |
| FIRST WINDING |
| FIRST WINDING |
| SECOND WINDING B |
| FIRST WINDING |
| SECOND WINDING A |
| FIRST WINDING |

*FIG. 4*

TECHNIQUES FOR A COUPLED INDUCTOR CIRCUIT

TECHNICAL FIELD

This application provides techniques for coupled inductor circuits for DC-DC voltage converters or regulators.

BACKGROUND

DC-DC switching regulators may use high-frequency switching to generate a desired output voltage for an electronic device. In certain applications, the demand for low voltage electronics to accept relatively high supply voltages creates challenges for stepping down the supply voltage to a low supply voltage. Similar challenges can also be found in step-up applications where a high supply voltage is converted from a low input supply voltage.

SUMMARY OF THE DISCLOSURE

A multiple-layer planar transformer can have a multiple-turn first planar winding implemented on multiple layers of a substrate and a single-turn second winding implemented on multiple layers of the substrate. The first and second windings can be magnetically coupled such as via a core. The individual planar traces of the second winding can be electrically coupled in parallel such as to allow for an efficient layout of the transformer that can allow for an improved power density.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 illustrates a stack configuration for an example planar transformer according to the present subject matter.

DETAILED DESCRIPTION

Planar transformers, planar inductors that are magnetically coupled, or coupled inductor circuits, can employ a u-shaped or horseshoe-shaped planar conductive trace to form a single turn of a transformer winding. An assembly of several layers of the planar windings can allow for a very compact transformer circuit that can include output inductors such as for filtering.

Figure 1:
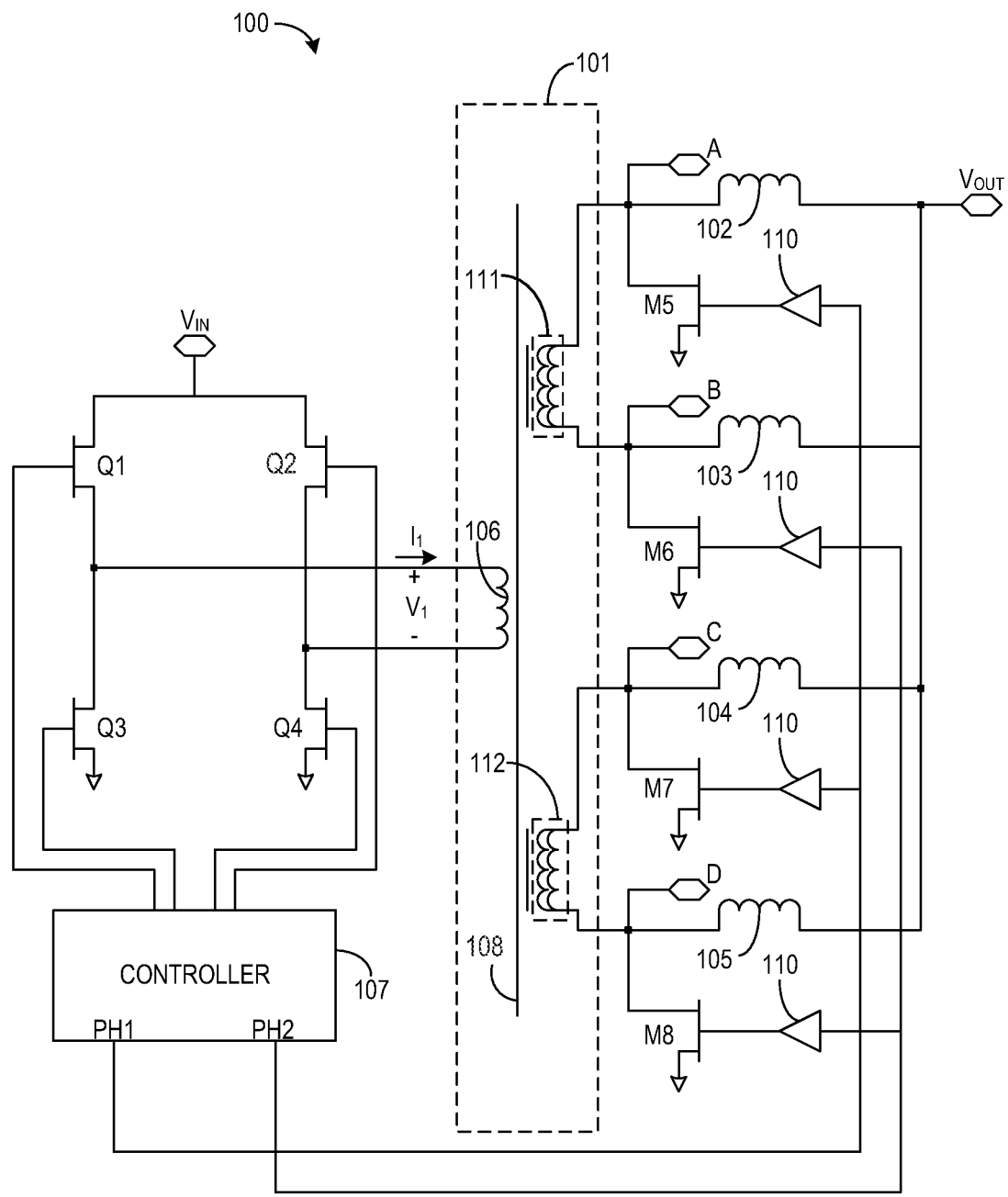
FIG. 1 illustrates generally a schematic of an example planar transformer system according to the present subject matter.

FIG. 1 illustrates generally a schematic of an example planar transformer system 100 according to the present subject matter. The planar transformer system 100 can include a planar transformer 101, a first set of switches (Q1-Q4), a second set of switches (M5-M8), output inductors 102, 103, 104, 105 and a controller 107. one or more switches of the first set of switches (Q1-Q4) or the second set of switches (M5-M8) can be accompanied by an optional gate driver 110. The planar transformer 101 can include a core 108, a first winding 106, and a second winding such as can include two portions 111, 112. The first winding 106 can include a number of turns and typically can include more than one turn. Each portion 111, 112 of the second winding can have a single turn.

The first winding 106 can be either a primary winding of the planar transformer or a secondary winding of the planar transformer. The first winding 106 is referred to as a primary winding unless noted otherwise. The first set of switches (Q1-Q4) can be controlled by the controller 107 and can operate to recurrently or periodically connect and disconnect the primary winding 106 to voltage supply nodes and to establish a cyclical primary voltage across the first winding 106 and a cyclical primary current through the first winding 106. The portions 111, 112 of the second winding can be magnetically coupled to the first winding 106 via the core 108. The core 108 can include an air core, a metal core or other materials capable of providing a flux link.

The controller 107 can control the first set of switches (Q1-Q4) and the second set of switches (M5-M8) such as to provide an output voltage ($V_{OUT}$) different than the input voltage ($V_{IN}$). In the illustrated planar transformer system 100, the output voltage ($V_{OUT}$) can be lower than the input voltage ($V_{IN}$) but the subject matter is not so limited. When the planar transformer 101 is operated as a step-down transformer, the controller 107 can control the first set of switches (Q1-Q4) to oscillate or alternate a polarity of the input voltage ($V_{IN}$) across the first winding 106. When the planar transformer 101 is operated as a step-down transformer, the controller 107 can operate or synchronize the second set of switches (M5-M8) to extract power from the winding segments, or portions, of the second winding. The second set of switches (M5-M8) can be controlled with two phase signals (PH1, PH2), such as discussed below with respect to FIG. 3. The output inductors 102, 103, 104, 105 can filter or smooth the periodic voltage and switching spikes developed on the second windings such as to provide a relatively constant output voltage. In certain examples, the output inductors 102, 103, 104, 105 can include but are not limited to, magnetic core inductors, crystalline core inductors, etc.

Figure 2:
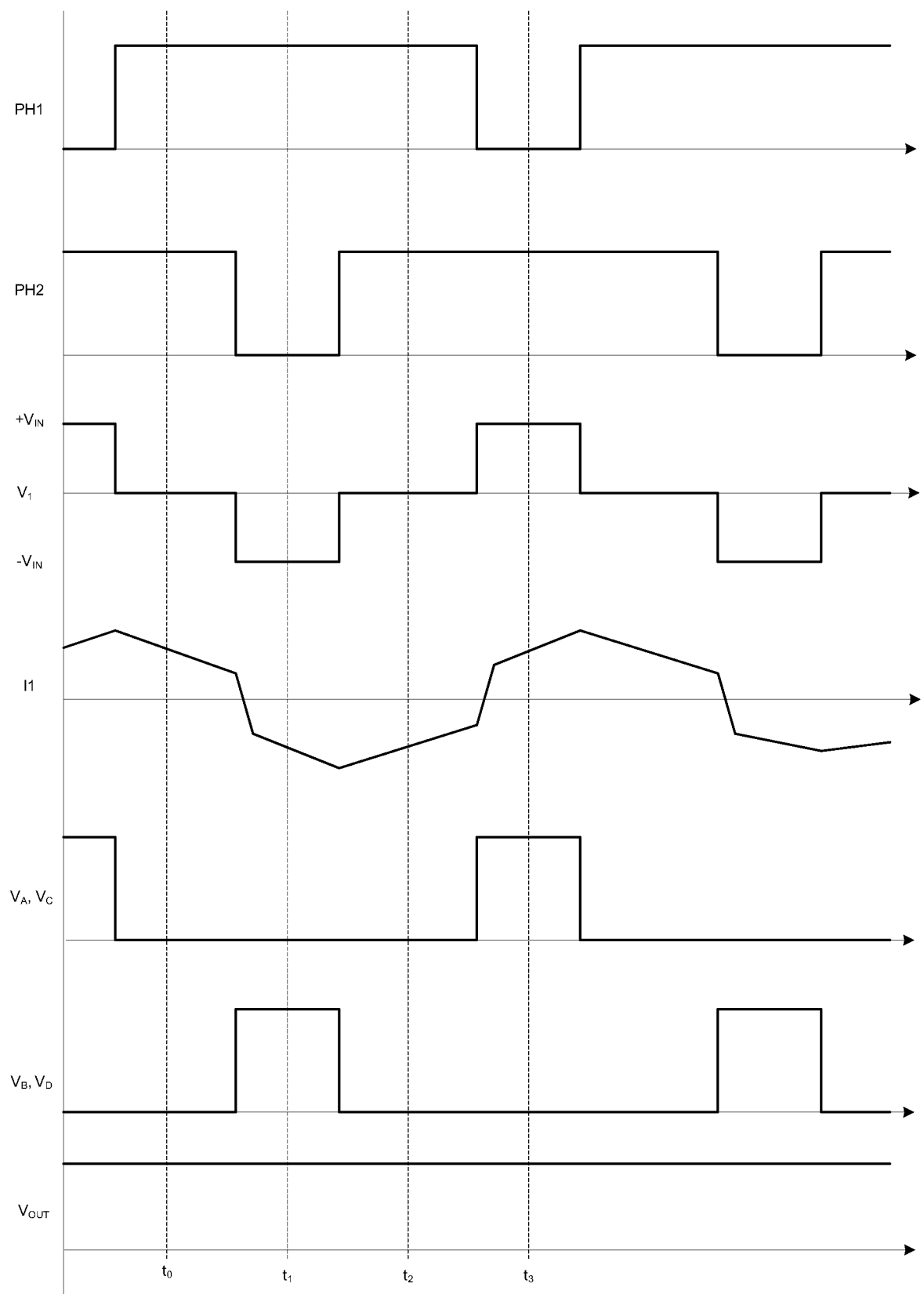
FIG. 2 illustrates generally plots of signal waveforms illustrating the operation of the planar transformer system of FIG. 1.

FIG. 2 illustrates generally plots of signal waveforms illustrating an example of the operation of the planar transformer system of 100 of FIG. 1. The plots include the logic level of the phase 1 (PH1) and phase 2 (PH2) signals that control the switches (M5-M8) of the second winding, the voltage ($V_1$) across the first winding, the current (I1) in the first winding, voltages ($V_A$, $V_B$, $V_C$, $V_D$) at the nodes (A, B, C, D) of the second winding, and the output voltage ($V_{OUT}$) of the step-down transformer.

In general, the transformer operates in one of three phases to capture an output voltage induced by the first winding during the transitions associated with the supply voltage being applied to, or isolated from the first winding. When the supply voltage ($V_{IN}$) is applied to, or isolated from, the first winding, the change in current (I1) through the first winding can induce a voltage across each second winding segment. By switching the connections of the second winding segments to capture the voltage induced as current polarity of the first winding is changed, a stepped-down DC voltage can be captured at the output inductors. The plot of signals assumes that a logic high places each switch, or transistor, in a low impedance state (e.g., "on") and a logic low places each switch in a high impedance state (e.g., "off"). However, switches or transistors responding to logic commands differently can be used.

In FIG. 2, at to, the first winding circuit is in a first, free-wheeling state and the second winding circuit has all the switches (M5-M8) "on" (e.g., PH1=PH2="high"), thus, each node (A, B, C, D) of the second winding is connected to ground. The "free-wheeling" state of the first winding allows any current in the first winding to continue to flow until terminated by the circuit losses. Any current in the output inductors (e.g., FIG. 1, 102, 103) can be discharged to the output terminal, or charges the output voltage node ($V_{OUT}$).

At $t_1$, the first winding circuit moves to the second state, and a supply voltage can be applied across the first winding with a first polarity ($-V_{IN}$). Applying the supply voltage ($V_{IN}$) can induce a change in current (I1) of the first winding and a voltage can be induced across the winding segments of the second windings. For example, at or in response to applying the supply voltage ($-V_{IN}$) on the first winding, the switches (FIG. 1; M6, M8) associated with the phase 2 control signal (PH2) can be turned "off". The change in current (I1) of first winding can induce a voltage at the drains (B, D) of the switches (FIG. 3; M6, M8) associated with the phase 2 control signal (PH2). The magnetic coupling of the planar first and second windings can be such that the induced voltage ($V_B$, $V_D$) of the segments of the second winding can match the sharp, pulse shape of the supply voltage ($V_{IN}$) applied to the first winding. At t1, the phase 2 signal (PH2) is low and the associated switches (M6, M8) are "off". The first winding 106, or primary winding for this step-down application, sees the full change in voltage across the winding terminals (e.g., $V_{IN}$). Voltages across the connected winding segments of each of the second windings is given by:

$$V_B = V_D = \frac{V_{IN}}{N},$$

Where N is the turns ratio of the primary winding to each individual secondary winding. Assuming a load at the output terminal of the planar transformer system, current in the output inductors 102, 103 can increase due to positive voltage across them.

At $t_2$, the controller can transition the first winding back to the first, free-wheeling state and the second winding circuit has all the switches (M5-M8) "on" (e.g., PH1=PH2="high"), thus, coupling each node of the second windings to ground. As before, any current flowing in the first winding continues to flow because the first winding inductance resists a change in current flow. The current may fall slightly during the free-wheeling state due to losses in the circuit. Any current in the output inductors (e.g., FIG. 1, 102, 103) is discharged to the output terminal, or charges the output voltage node ($V_{OUT}$).

At $t_3$, the first winding circuit moves to the third state, and the supply voltage ($V_{IN}$) can be applied across the first winding with a second polarity ($+V_{IN}$). Applying the supply voltage ($V_{IN}$) can induce a change in current (I1) of the first winding and voltage can be induced across segments of the second winding. For example, at or in response to applying the supply voltage ($+V_{IN}$) on the first winding, the switches (M5, M7) associated with the phase 1 control signal (PH1) can be turned "off". The change in current (I1) of first winding can induce a voltage at the drains (A, C) of the switches (FIG. 3; M5, M7) associated with the phase 1 control signal (PH1). The magnetic coupling of the planar first and second windings can be such that the induced voltage ($V_A$, $V_C$) at the nodes of the second winding can match the sharp, pulse shape of the supply voltage ($V_{IN}$) applied to the first winding. At t3, the phase 1 signal (PH1) is low and the associated switches (M5, M7) are "off". The first winding 106, or primary winding for this step-down application, sees the full change in voltage across the winding terminals. Voltages across the connected winding segments of each of the second windings can be given by:

$$V_A = V_C = \frac{V_{IN}}{N},$$

Where N is the turns ratio of the primary winding to each individual secondary winding. Assuming a load at the output terminal of the planar transformer system, current in the output inductors 102, 103 can increase due to positive voltage across them.

Figure 3:
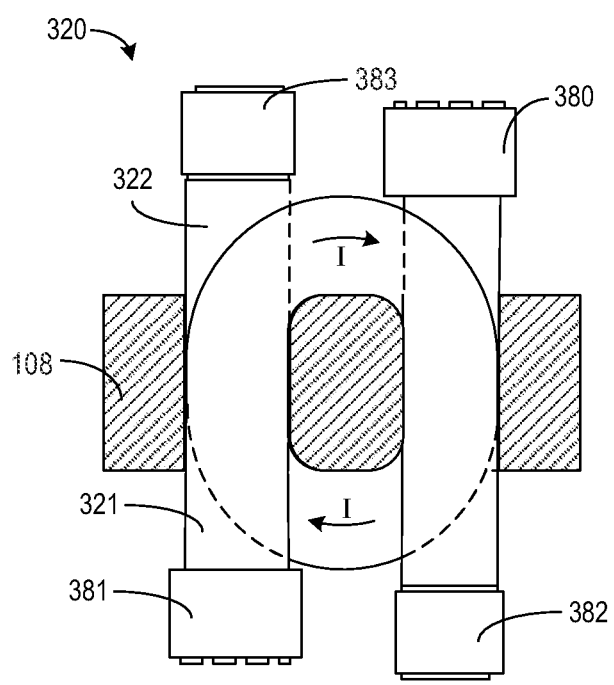
FIG. 3 illustrates generally an example layout of conductive traces of sub-portions of an example second winding according to the present subject matter.

FIG. 3 illustrates generally an example layout 320 of conductive traces of sub-portions of an example second winding according to the present subject matter. For example, FIG. 3 illustrates the overlay of two, single-turn, planar sub-portions 321, 322 that can form a portion (e.g., FIG. 1, 111, 112) of the second winding as discussed above. In certain examples, the example layout 320 can include the core 108, a first sub-portion 321 of a first portion of the second winding, a first sub-portion 322 of a second portion of the second winding, first and second inductors 382, 383, and first and second switches 380, 381. The layout 320 can use nearly identical layouts for each sub-portion 321, 322 but rotated 180 degrees from each other. The rotated, mirrored, or complimentary nature of the layout of each single turn sub-portion 321, 322 allows the inductors 382, 383 and switches 380, 381 to be compactly positioned with minimal, if any, additional routing of the conductive portion of each single turn sub-portion 321, 322. Such reduction in routing allows each sub-portion to reduce or minimize losses compared to conventional layouts of planar transformers. In addition, when current (I) is induced in each sub-portion 322, 321, the current (I) can flow in the same direction about the post of the core 108 thus reinforcing the magnetic coupling between the second winding and the first winding. Although a single pair of sub-portions include all the nodes for coupling to the switches and inductors and can provide a basic step-up or step-down voltage function, a second pair of sub-portions can allow higher output current with little if any increase in circuit footprint.

FIG. 4 illustrates a stack configuration for an example planar transformer 400 according to the present subject matter. In this illustrative example, the planar transformer 400 can include a 6:1 turn ratio between the first winding and the second winding, but the present subject matter is not so limited. The planar transformer 400 can include a single post core but the present subject matter is not so limited. The stack can include 9 layers including five layers for routing the six turns of the first winding and 4 layers for routing two pairs (SECOND WINDING A, SECOND WINDING B) of sub-portions of the second winding.

Figure 5A:
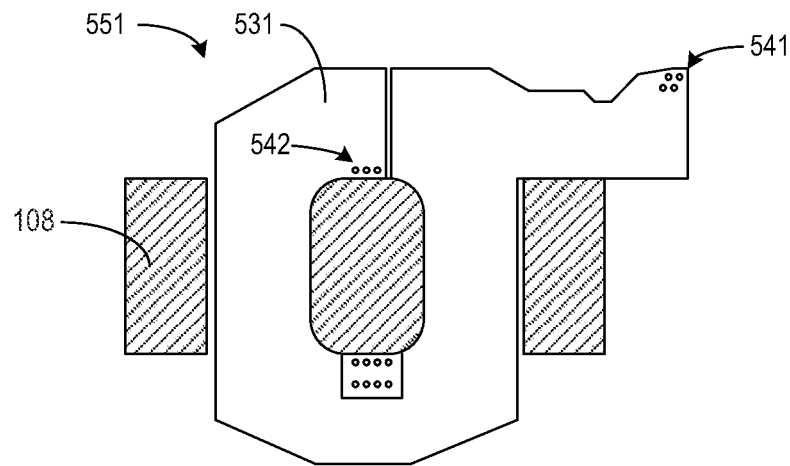
FIGS. 5A-5E illustrate generally layouts of conductive portions of the first winding within each of the five layers of the example planar transformer 400 of FIG. 4.
Figure 5B:
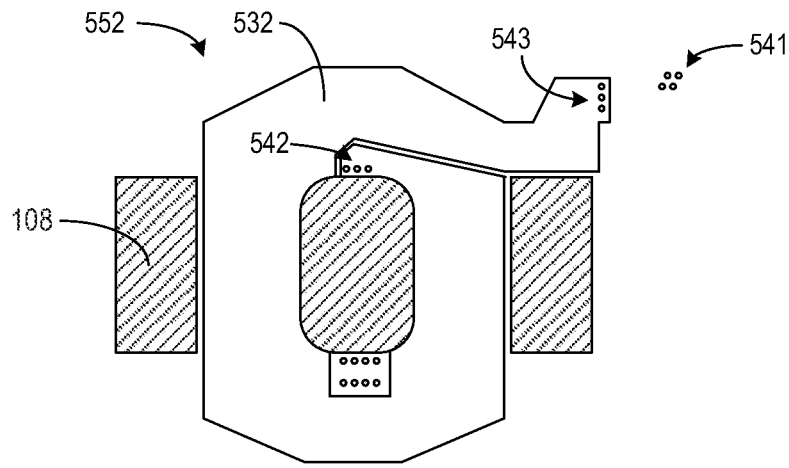

FIGS. 5A-5E illustrate generally layouts of conductive portions of the first winding within each of the five layers of the example planar transformer 400 of FIG. 4. FIG. 5A illustrates a first layer 551 of a portion of the first winding of the example planar transformer that includes a first conductive portion 531 routed to provide a single turn of the first winding. The first conductive portion 531 can have a first node 541 or first set of vias for coupling to a voltage source, or load, and a second set of vias 542 for coupling to a second layer of the first winding. In certain examples, the first node 541 can correspond to a first node of the intermediate nodes of the first set of switches (e.g., FIG. 1, Q1-Q4). FIG. 5B illustrates generally a second layout 552 of a portion of the first winding of the example planar transformer of FIG. 4. The second layer 552 can include a second conductive portion 532 of the first winding routed to provide a single turn or more of the first winding. A first end of the second conductive portion 532 can electrically connect with the first conductive portion 531 of the first winding using the second set of vias 542. A second end of the second conductive portion 532 can couple to a third set of vias 543.

Figure 5C:
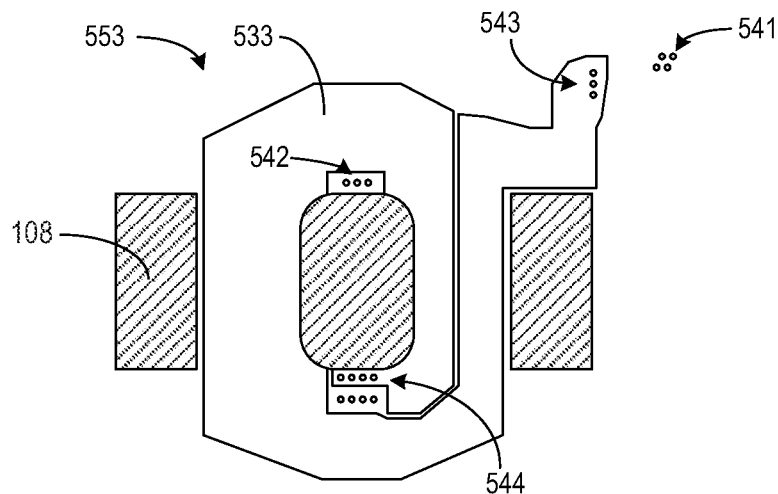

FIG. 5C illustrates generally a third layout 553 of a portion of the first winding of the example planar transformer 400 of FIG. 4. The third layer 553 can include a third conductive portion 533 of the first winding routed to provide a single turn or more of the first winding. A first end of the third conductive portion 533 can electrically connect with the second conductive portion 532 of the first winding using the third set of vias 543. A second end of the third conductive portion 533 can couple to a fourth set of vias 544.

Figure 5D:
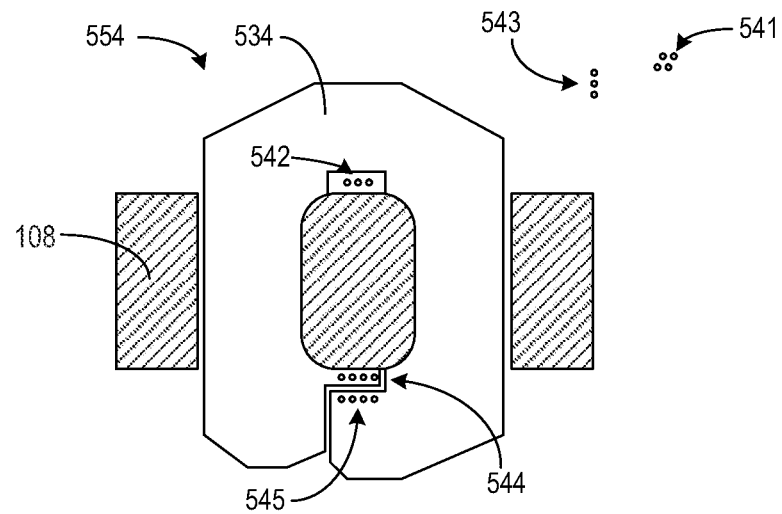

FIG. 5D illustrates generally a fourth layout 554 of a portion of the first winding of the example planar transformer 400 of FIG. 4. The fourth layer 554 can include a fourth conductive portion 534 of the first winding routed to provide a single turn of the first winding. A first end of the fourth conductive portion 534 can electrically connect with the third conductive portion 533 of the first winding using the fourth set of vias 544. A second end of the fourth conductive portion 534 can couple to a fifth set of vias 545.

Figure 5E:
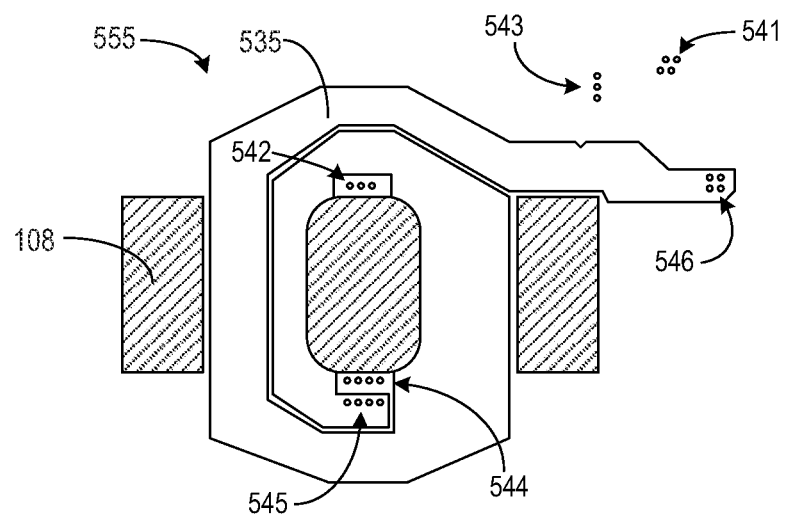

FIG. 5E illustrates generally a fifth layer 555 of a portion of the first winding of the example planar transformer of FIG. 4. The fifth layer 555 can include a fifth conductive portion 535 of the first winding routed to provide about a turn and one half of the first winding. A first end of the fifth conductive portion 535 can electrically connect with the fourth conductive portion 534 of the first winding using the fifth set of vias 545. A second end of the fifth conductive portion 535 can couple to a sixth set of vias 546. In certain examples, the sixth set of vias 546 can be at least part of a second node of the first winding and can correspond to a second node of the intermediate nodes of the first set of switches (e.g., FIG. 1, Q1-Q4).

For the planar transformer 400 of FIG. 4, and increasingly numbering the nine layers from the bottom to the top, the first layout 551 of the first winding can be part of layer 4, the second layout 552 of the first winding can be part of layer 2, the third layout 553 of the first winding can be part of layer 7, The fourth layout 554 of the first winding can be part of layer 9, and the fifth layout 555 of the first winding can be part of layer 5. In the illustrated example, the serial connection of each of the five layouts (551-555) of the first winding forms six turns around the center post of the core 108. It is understood that other configurations of portions of the first winding that include the same or a different number of turns are possible without departing from the scope of the present subject matter.

Figure 6A:
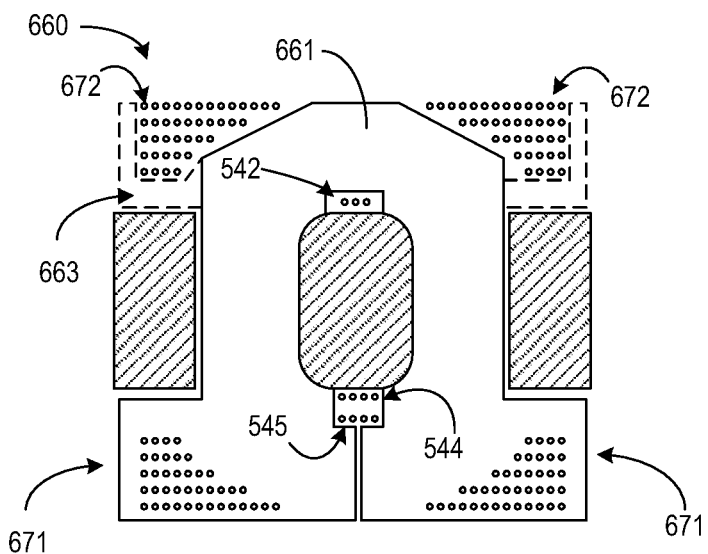
FIGS. 6A and 6B illustrate generally layouts 660, 670 of sub-portions of the second winding of the example planar transformer 400 of FIG. 4.
Figure 6B:
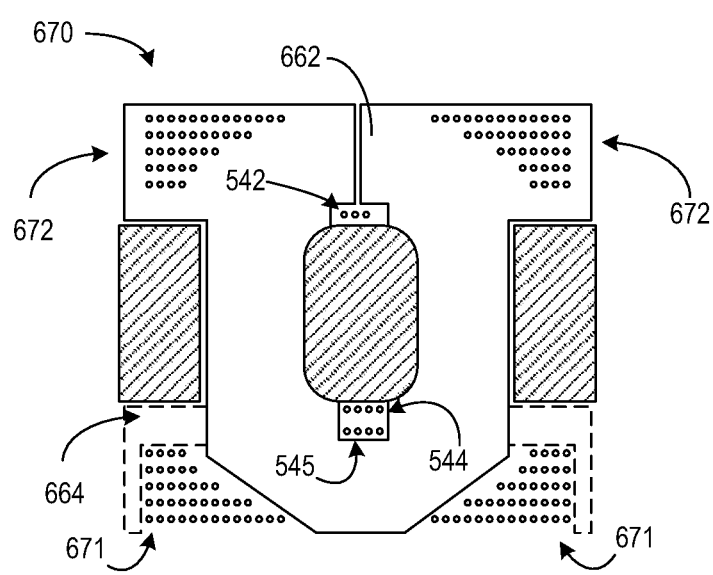

FIGS. 6A and 6B illustrate generally layouts 660, 670 of sub-portions of the second winding of the example planar transformer 400 of FIG. 4. FIG. 6A illustrates generally an example layout 660 of a first sub-portion of the second winding. The layout 660 can include the core 105, a first conductive portion 661 routed to form a single turn of the second winding. The single-turn planar conductor can substantially enclose a void with a small opening to the void to isolate the ends of the conductor. For example, the single-turn planar conductor can be in the form of a "horseshoe", or other U-shape that is mostly closed about a center void but includes a gap to prevent full closure about the center void. Some single-turn planar conductors can have a "hook-shape". The layout 660 can also include first and second sets of vias 671, 672. The first set of vias 671 can be used to connect the first sub-portion with a second, parallel-connected, first sub-portion, one or more output inductors, one or more switches, or combinations thereof to form one of the two portions (111, 112) of the example planar transformer 400 of FIG. 4. In certain examples, the layout 660 can be used for two layers of the nine layers of the example planar transformer 400 of FIG. 4.

FIG. 6B illustrates generally an example layout 670 of a second sub-portion of the second winding. The layout 670 can include the core 108, a second conductive portion 662 routed to form a single turn of the second winding. The single turn can be in the form of a "horseshoe" or "U-shaped". The orientation of the second conductive portion 662 can complement the orientation of the first conductive portion 661, or can generally mirror or reflect the orientation of the first conductive portion. In general, the orientation of the first and second conductive portions 661, 662 is opposite each other such that the direction of the ends of one conductive portion is opposite the direction of the corresponding ends of the other conductive portion to allow for compact arrangement of other components of the second winding. As another example, the arrangement of the second conductive portion 662 may be referred to as being rotated about 180 degrees when stacked with and compared to a corresponding first sub-portion (e.g., layout 660) such as to support an over-all, compact planar transformer. The layout 670 can also include the first and second sets of vias 671, 672. The second set of vias 672 can be used to connect the second sub-portion 622 with a second, parallel-connected second sub-portion, one or more inductors, one or more switches, or combinations thereof to form one of the two portions (111, 112) of the example planar transformer 400 of FIG. 4. The first set of vias 671 can be isolated from the second conductive portion 662 of the second winding and can be used to couple together components of a second portion of the second winding. In certain examples, each portion of the second winding can include more or less numbers of planar conductive portions (e.g., 661, 662) to assist in more closely coupling the second winding with the first winding.

With regard to the example planar transformer 400 of FIG. 4, and increasingly numbering the nine layers from the top to the bottom, the example layout 660 of a first sub-portion of the second winding can be part of layers 1 and 8, and the example layout 670 of a second sub-portion of the second winding can be part of layers 3 and 6. In the illustrated example, a first portion of the second winding can be formed by the parallel connection of layers 1 and 8 and the second portion of the second winding can be formed by the parallel connection of layers 3 and 6. It is understood that other configurations of sub-portions of the second winding are possible without departing from the scope of the present subject matter. In certain examples, each conductive portion 661, 662 can include additional conductive areas 663, 664 to assist with coupling the second winding with the first winding.

Figure 7A:
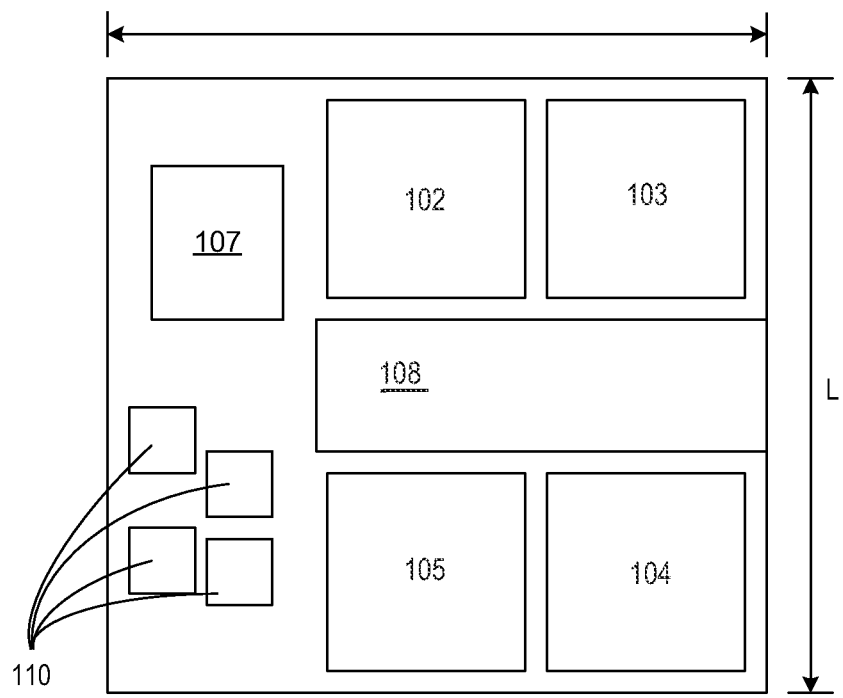
FIGS. 7A and 7B illustrate generally various views of a physical specimen of an example planar transformer according to the present subject matter.
Figure 7B:
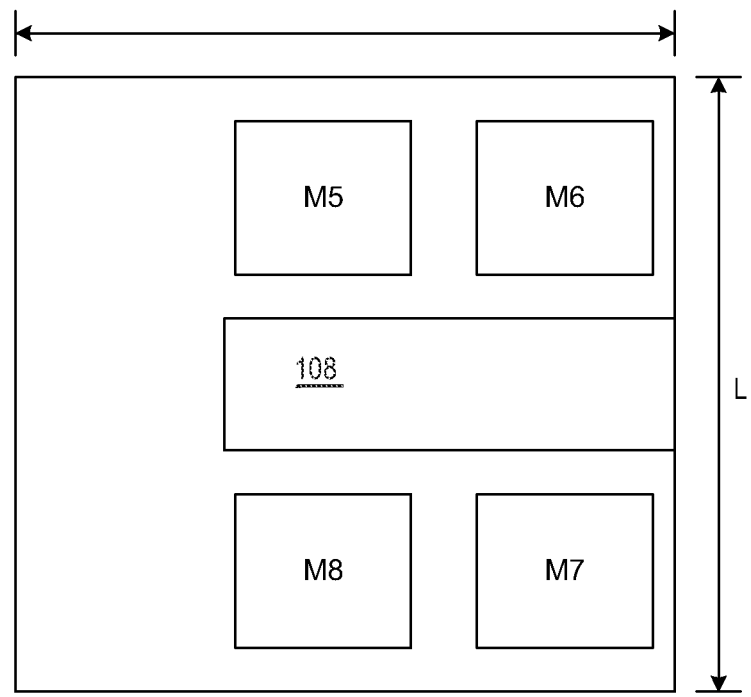

FIGS. 7A and 7B illustrate generally various views of a physical specimen of an example planar transformer package according to the present subject matter. FIG. 7A illustrates a top view of the example planar transformer. The top view shows the multiple layer substrate, the core, four inductors coupled to the second winding, a controller and other control components such as drivers for the second set of switches. FIG. 7B illustrates a bottom view of the example planar transformer package. The bottom view shows the multiple layer substrate, the core, the second set of switches, and additional ancillary control components. In an example, the power density for a planar transformer according to the present subject matter can be greater than 50 kilowatts per liter (kW/L). Such power density is provided by the complementary orientation of the various sub-portions of the second winding as discussed above. In an example, a planar transformer with greater than 50 kW/L power density can provide an output voltage of 3.3 volts at 140 amperes from a 54 volt supply voltage. The overall dimensions of such an example can be 24.5 mm (L)×24 mm (W)×15 mm.

Figure 8:
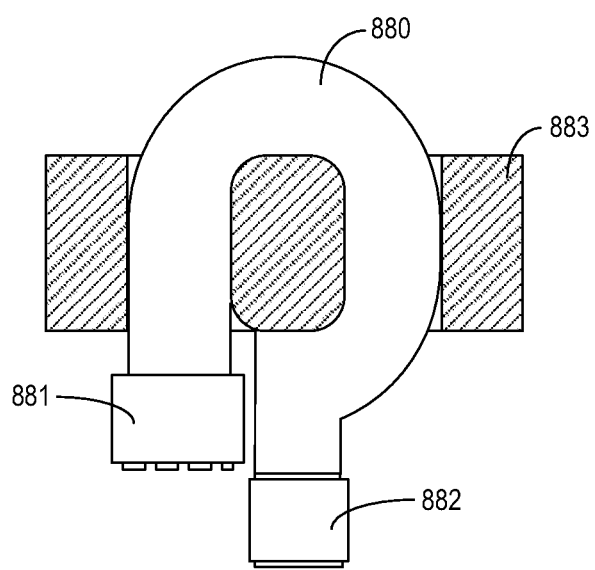
FIG. 8 illustrates a conductive trace of a layer having a portion of a second winding for a center-tap configuration of an example planar transformer.

FIG. 8 illustrates a conductive trace 880 of a layer having a portion of a second winding for a center-tap configuration of an example planar transformer. In certain examples, the conductive trace 880 can have a question mark type shape or a hook shape that approximates a single turn of the second winding. The shape allows for control components such as switches 881 and inductors 882 associated with the portion of the second winding to be compactly arranged about a core 883.

Figure 9:
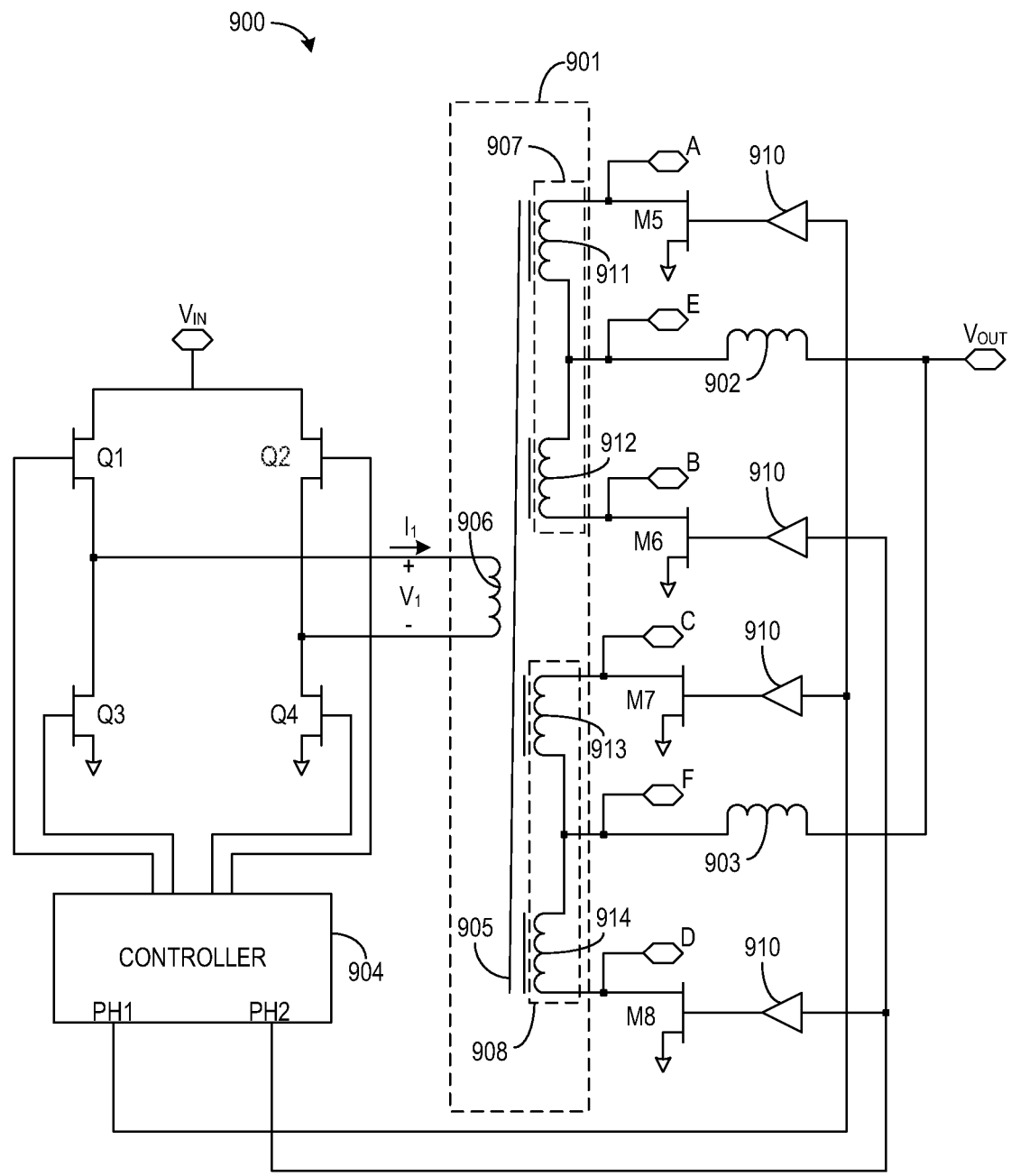
FIG. 9 illustrates generally a circuit for an example planar transformer system having a center-tap configuration according to the present subject matter.

FIG. 9 illustrates generally a circuit for an example planar transformer system 900 having a center-tap configuration according to the present subject matter. The planar transformer system 900 can include a planar transformer 901, a first set of switches (Q1-Q4), a second set of switches (M5-M8), output inductors 902, 903 and a controller 904. In some examples, one or more switches of the first set of switches and the second set of switches can be accompanied by a gate driver 910. The planar transformer 901 can include a core 905, a first winding 906, and one or more second windings 907, 908. The first winding 906 can include a number of turns and typically can include more than one turn. Each second winding 907, 908 can include a number of winding segments 911, 912, 913, 914. Each winding segment 911, 912, 913, 914 can form single turn of a second winding 907, 908. As used herein, a winding segment includes the primary conductive portion of a turn of a second winding and does not include ancillary parts of the second winding such as an external terminal, a fuse, a switch, etc.

The first winding can be either a primary winding of the planar transformer or a secondary winding of the planar transformer. In FIG. 9, the first winding 906 is referenced as a primary winding unless noted otherwise. The first set of switches (Q1-Q4) are controlled by the controller 904 and operate to recurrently or periodically connect and disconnect the primary winding 906 to voltage supply rails and to establish a cyclical primary voltage across the first winding 906 and a cyclical primary current through the first winding 906. The second windings 907, 908 can be magnetically coupled to the first winding 906 via the core 905. The core 905 can be an air core, a magnetic core with an air gap, or any materials and structures capable of providing a flux link.

The controller 904 can control the first set of switches (Q1-Q4) and the second set of switches (M5-M8) to provide an output voltage ($V_{OUT}$) different than the input voltage ($V_{IN}$). In the illustrated planar transformer system 900, the output voltage ($V_{OUT}$) is lower than the input voltage ($V_{IN}$) but the subject matter is not so limited. When the planar transformer 901 is operated as a step-down transformer, the controller 904 can control the first set of switches (Q1-Q4) to oscillate or alternate a polarity of the input voltage ($V_{IN}$) across the first winding 906. When the planar transformer 901 is operated as a step-down transformer, the controller 904 can operate or synchronize the second set of switches (M5-M8) to extract power from the winding segments of the second winding. The second set of switches can be controlled with two phase signals (PH1, PH2). In certain examples, each second winding 907, 908 can be configured to include one or more taps (E, F) between connected winding segments (911/912 and 913/914). In certain examples, the tap (E, F) between winding segments can allow the output voltage ($V_{OUT}$) to include a step-up or step-down multiplier of the input voltage ($V_{IN}$). In addition, compared to conventional methods and even recent planar techniques, the tap (E, F) between the connected winding segments (911/912 and 913/914) can help reduce the complexity or the cost of the overall planar transformer design by using fewer switches. Furthermore, the tap (E, F) between the winding segments also allows for use of output inductors 902, 903 with much lower inductance to smooth the output voltage ($V_{OUT}$). The lower inductance of the output inductors 902, 903 results from the circuit implementation using parasitic inductance of the other planar transformer components to smooth output ripple in the output voltage ($V_{OUT}$). The output inductors 902, 903 can be coupled between a corresponding tap (E, F) and an output voltage terminal of the planar transformer system 900. In certain examples, the output inductors 902, 903 can include air-core inductors.

Figure 10:
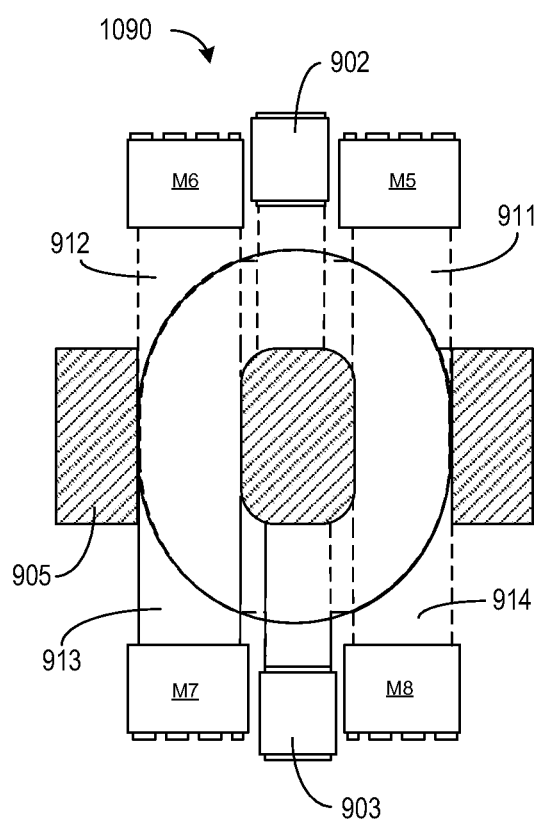
FIG. 10 illustrates generally an example compact layout of the second winding of the example circuit of FIG. 9.

FIG. 10 illustrates generally an example compact layout 1090 of the second winding of the example circuit of FIG. 9, including the output inductors 902, 903 and the second set of switches (M5-M8). In certain examples, the conductive traces or winding segments 911, 912, 913, 914 of each portion of the second winding can include respective conductive traces that can be located on multiple layers of the substrate of an example center-tap, planar transformer. Conductive traces associated with a particular winding segment of the second winding can be coupled together in parallel such as to handle higher currents as additional layers of the substrate add a small vertical dimension to the transformer without adding to the larger planar footprint of the transformer.

Figure 11:
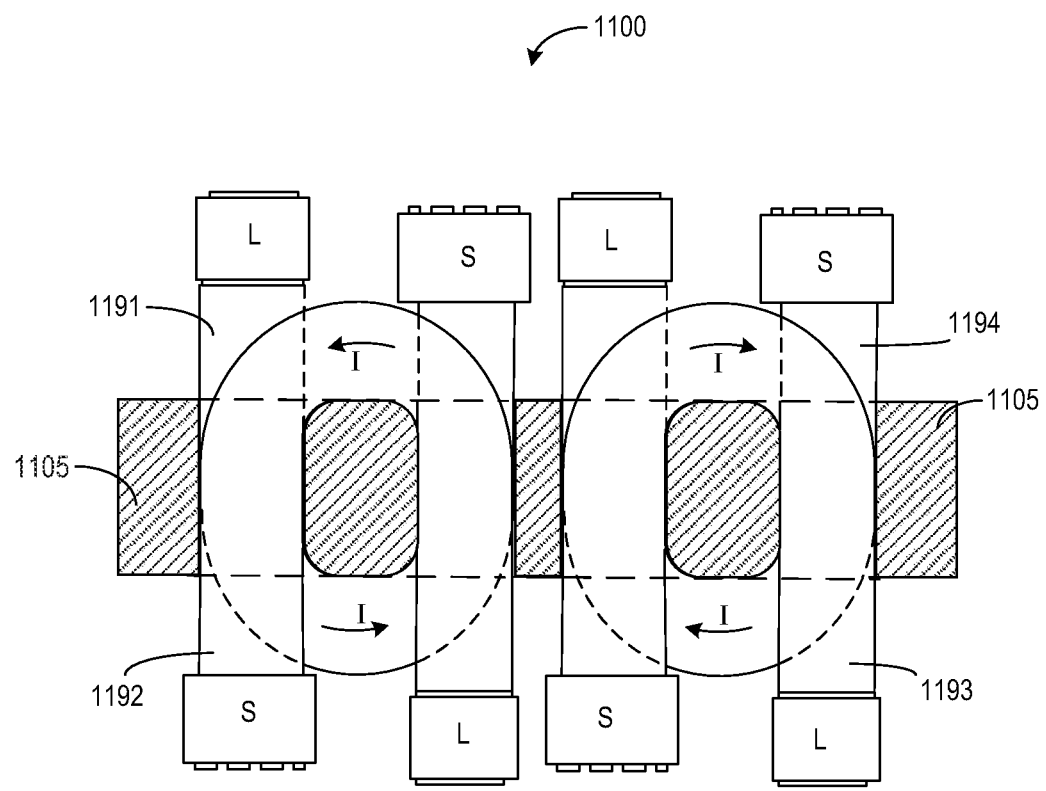
FIG. 11 illustrates generally an example portion of planar transformer configured, for example, to provide multiple voltage outputs.

FIG. 11 illustrates generally an example portion of planar transformer 1100 configured, for example, to provide multiple voltage outputs. The example portion illustrates generally a core 1105 including multiple posts, and sub-portions 1191, 1192, 1193, 1194 of a second winding about each post. The portion of the planar transformer 1100 also shows a compact layout for filter inductors (L) and switches (S) for electrically coupling the sub-portions of the second winding as discussed above, for example to ensure current (I) flow on each sub-portion is in the same direction about the respective post of the core 1105. Using the techniques discussed above, the planar transformer 1100 can provide multiple output voltages or a single output voltage with more output current capacity from a multiple-layer substrate package having a very small height.

Figure 12:
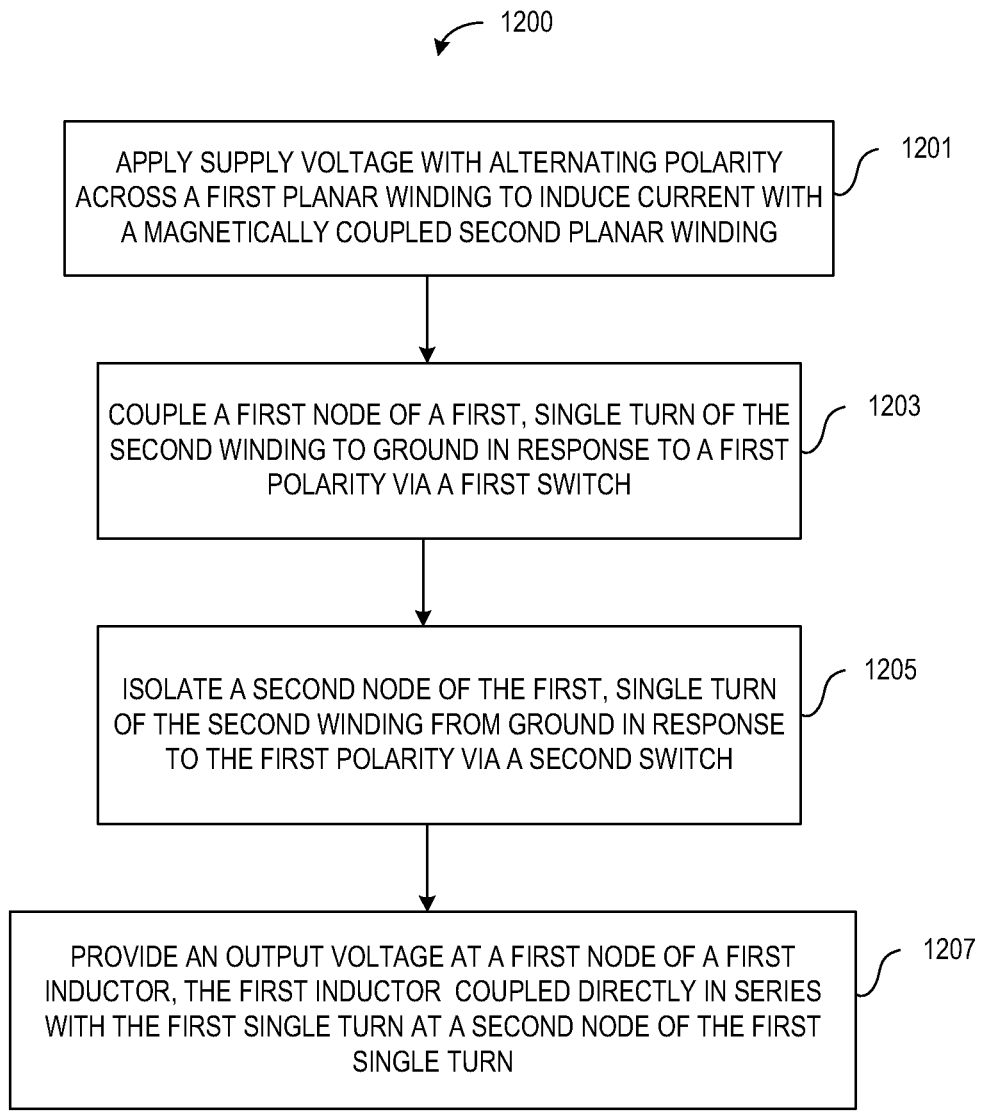
FIG. 12 illustrates generally a flowchart of an example step-down method for operating a planar transformer according to the present subject matter.

FIG. 12 illustrates generally a flowchart of an example step-down method 1200 for operating a planar transformer according to the present subject matter. At 1201, a supply voltage can be applied, with alternating polarity, across a first planar winding of the planar transformer. The first planar winding can have multiple turns about a post of a metallic core to induce a current in a second planar winding of the planar transformer. At 1203, a first node of a first, single turn of the second winding can be coupled to ground in response to a first polarity of the supply voltage via a first second winding switch. The ground connection of the second winding can provide a reference potential for an induced voltage across the second winding. At 1205, a second node of the first single turn can be isolated from ground in response to the first polarity of supply voltage via a second switch. Isolating the second node allows current induced in the second winding to provide an output voltage of the planar transformer. At 1207, the output voltage can be provided at a first node of a first inductor coupled to the first single turn. The first inductor can be directly coupled in series with the first single turn at a second node of the first single turn. The first inductor, for the step-down configuration can provide filtering of the output voltage. In certain examples, current stored in the output inductor can assist in smoothing the output voltage level as the alternating polarity of the supply voltage is switched across the first planar winding.

In certain examples, the single turn can include multiple, parallel-connected conductive traces. Via a multiple layer substrate, the conductive traces can be stacked to provide a very space efficient planar transformer. In addition, by orienting some conductive traces 180 degrees with respect to other conductive traces, the transformer power density can be increased without increasing the major footprint of the planar transformer.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A coupled inductor circuit comprising;
a core;

a first planar winding comprising a conductive coil having an electrical path encircling a first post of the core;

a second planar winding configured to magnetically couple with the first planar winding via the core, the second planar winding having a plurality of segments;

wherein the plurality of segments includes:
  a first segment comprising an individual U-shaped planar conductive trace about the first post, a first inductor coupled to a first end of the individual U-shaped planar conductive trace of the first segment and a first switch coupled to a second end of the individual U-shaped planar conductive trace of the first segment;
  a second segment comprising an individual U-shaped planar conductive trace about the first post; and
  wherein a layout of the first segment is opposite a layout of the second segment.

2. The coupled inductor circuit of claim 1, wherein the second segment includes:
  a second inductor coupled to a first end of the individual U-shaped planar conductive trace of the second segment; and
  a second switch coupled to a second end of the individual U-shaped planar conductive trace of the second segment.

3. The coupled inductor circuit of claim 2, including a first set of switches configured to apply an input voltage in a sequence of alternate polarity to the first planar winding.

4. The coupled inductor circuit of claim 3, including a controller configured to control the first set of switches, the first switch, and the second switch.

5. The coupled inductor circuit of claim 4, including a multiple layer substrate, the multiple layer substrate including at least two layers configured to form the first planar winding, the at least two layers including:
  a first layer including a first conductive trace configured to form a first portion of the first planar winding; and
  a second layer including a second conductive trace configured to form a second portion of the first planar winding.

6. The coupled inductor circuit of claim 5, wherein the first conductive trace of the first layer forms more than a single turn of the first planar winding.

7. The coupled inductor circuit of claim 2, wherein a node of the first inductor is coupled directly to a node of the second inductor to provide a first external terminal of the coupled inductor circuit.

8. The coupled inductor circuit of claim 7, wherein the first external terminal is configured to receive a supply voltage and the first planar winding is configured to provide an output voltage; and
  wherein the output voltage is configured to provide a stepped-up version of the supply voltage.

9. The coupled inductor circuit of claim 7, wherein the first external terminal is configured to provide an output voltage and the first planar winding is configured to receive a supply voltage; and
  wherein the output voltage is configured to provide a stepped-down version of the supply voltage.

10. The coupled inductor circuit of claim 1, wherein the coupled inductor circuit is configured to operate with a power density of greater than 50 kilowatts/liter.

11. A method of operating a step-down planar transformer:
  applying a supply voltage of alternating polarity to a first winding having multiple turns about a post of a core to induce a current in a second winding;
  coupling a first node of a first single turn of a second winding to ground in response to a first polarity of the alternating polarity via a first switch;
  isolating a second node of the first single turn from ground in response to a first polarity of the alternating polarity via a second switch;
  coupling a first node of a second single turn of the second winding to ground in response to a first polarity of the alternating polarity via a third switch;
  isolating a second node of the second single turn from ground in response to the first polarity of the alternating polarity via a fourth switch; and
  providing an output voltage at a first node of a first inductor and a second inductor, the first inductor coupled directly in series with the first single turn at the second node of the first single turn and the second inductor coupled directly in series with second single turn at the second node of the second single turn.

12. The method of claim 11, wherein the first node of the first inductor is coupled with the first node of the second inductor to provide the output voltage.

13. The method of claim 11, including:
  coupling the first node of a third single turn of the second winding to ground in response to a second polarity of the alternating polarity via the second switch;
  isolating a second node of the third single turn from ground in response to the second polarity of the alternating polarity via the first switch; and
  providing the output voltage at a first node of a third inductor, the third inductor coupled directly in series with the third single turn at a second node of the third single turn.

14. The method of claim 13, including:
  coupling a first node of a fourth single turn of the second winding to ground in response to the second polarity of the alternating polarity via the fourth switch;
  isolating a second node of the fourth single turn from ground in response to the second polarity of the alternating polarity via the third switch; and
  wherein providing the output voltage includes providing the output voltage at a first node of the third inductor and a fourth inductor, the fourth inductor coupled directly in series with the fourth single turn at a second node of the fourth single turn.

15. A planar transformer package comprising:
  a metallic core having a first post;
  a first winding about the first post, the first winding having multiple turns about the first post;
  a second winding about the first post, the second winding configured to provide a single turn about the first post;
  a multiple layer substrate, wherein the first post passes through each layer of the multiple layer substrate, the multiple layer substrate comprising:
  a first plurality of layers forming the first winding about the first post;
  a second plurality of layers of the multiple layer substrate forming the second winding, each of the layers of the second plurality of layers including a single turn of planar conductive material about the first post;
  wherein mounted on a first major exterior surface of the multiple layer substrate are multiple inductors coupled to a corresponding planar conductive material of the second plurality of layers and mounted to a second major exterior surface of the multiple layer substrate are multiple second winding switches coupled to the second winding;

wherein a first layer and a second layer of the second plurality of layers includes a first layout of the planar conductive material; and wherein, within the multiple layer substrate, the first layout of the first layer is complementary to the first layout of the second layer.

16. The planar transformer package of claim 15, wherein the metallic core includes an additional post; and wherein the multiple layer substrate includes:

an additional first winding about the additional post; and an additional second winding about the additional post.

* * * * *